United States Patent [19]

Scherer

[11] Patent Number: 5,728,280
[45] Date of Patent: Mar. 17, 1998

[54] APPARATUS FOR COATING SUBSTRATES BY CATHODE SPUTTERING WITH A HOLLOW TARGET

[75] Inventor: Michael Scherer, Rodenbach, Germany

[73] Assignee: Balzers Prozess Systeme GmbH, Hanau, Germany

[21] Appl. No.: 802,226

[22] Filed: Feb. 19, 1997

[30] Foreign Application Priority Data

Feb. 23, 1996 [DE] Germany ............ 196 06 715.4
Mar. 9, 1996 [DE] Germany ............ 196 09 249.3

[51] Int. Cl.$^6$ .................................................. C23C 14/34
[52] U.S. Cl. ............................. 204/298.18; 204/298.11; 204/298.23; 204/298.28; 204/298.25
[58] Field of Search ................... 204/298.11, 298.12, 204/298.15, 298.18, 298.21, 298.23, 298.28

[56] References Cited

U.S. PATENT DOCUMENTS

| | | | |
|---|---|---|---|
| 4,622,121 | 11/1986 | Wegmann et al. | 204/298.18 |
| 4,810,347 | 3/1989 | Smith | 204/298.18 |
| 4,834,860 | 5/1989 | Demaray et al. | 204/298.18 |
| 4,933,064 | 6/1990 | Geisler et al. | 204/298 |
| 5,069,770 | 12/1991 | Glocker | 204/192 |
| 5,330,632 | 7/1994 | Sichmann | 204/298.18 |
| 5,334,302 | 8/1994 | Kubo et al. | 204/298.18 |
| 5,378,341 | 1/1995 | Drehman et al. | 204/298.18 |
| 5,482,611 | 1/1996 | Helmer et al. | 204/298 |

FOREIGN PATENT DOCUMENTS

| | | |
|---|---|---|
| 0254168 | 1/1988 | European Pat. Off. . |
| 0297779 | 1/1988 | European Pat. Off. . |
| 0558797 | 9/1993 | European Pat. Off. . |
| 0676791 | 9/1994 | European Pat. Off. . |
| 292124 | 10/1983 | Germany . |
| 3541621 | 5/1987 | Germany . |
| 3706698 | 1/1988 | Germany . |
| 3835153 | 10/1988 | Germany . |
| 4127262 | 8/1991 | Germany . |
| 4211798 | 4/1992 | Germany . |
| 4336830 | 10/1993 | Germany . |

OTHER PUBLICATIONS

Hieber, K. "Radio–Frequency Sputter Deposition of Alloy Films".–Siemens Forsch. –u. Entwickl.–Ber., Bd. 11, 1982, Nr. 3, S. 145–148.

Horwitz, C. "Rf sputtering–voltage division between two–electrodes", J. Vac. Sci. Technol. A, 1(1), Jan.–Mar. 1983, S.60–68.

*Primary Examiner*—Nam Nguyen
*Attorney, Agent, or Firm*—Felfe & Lynch

[57] ABSTRACT

A pot-shaped hollow target (4) is open toward the substrate (3) that is to be coated, a dark-space shield (6) surrounds the lateral wall (5) of the target (4), and a cathode base body (11) is supported on an insulator (8) on the roof (9) of the vacuum chamber (2) and is connected electrically to a power source (10). A magnet belt (12) formed of a plurality of magnets (18, 18') surrounds the dark-space shield (6). A turntable (15) having an axis of rotation (16) parallel to and offset from the target's (4) perpendicular plane of symmetry (17) is provided for holding the substrates (3).

5 Claims, 1 Drawing Sheet

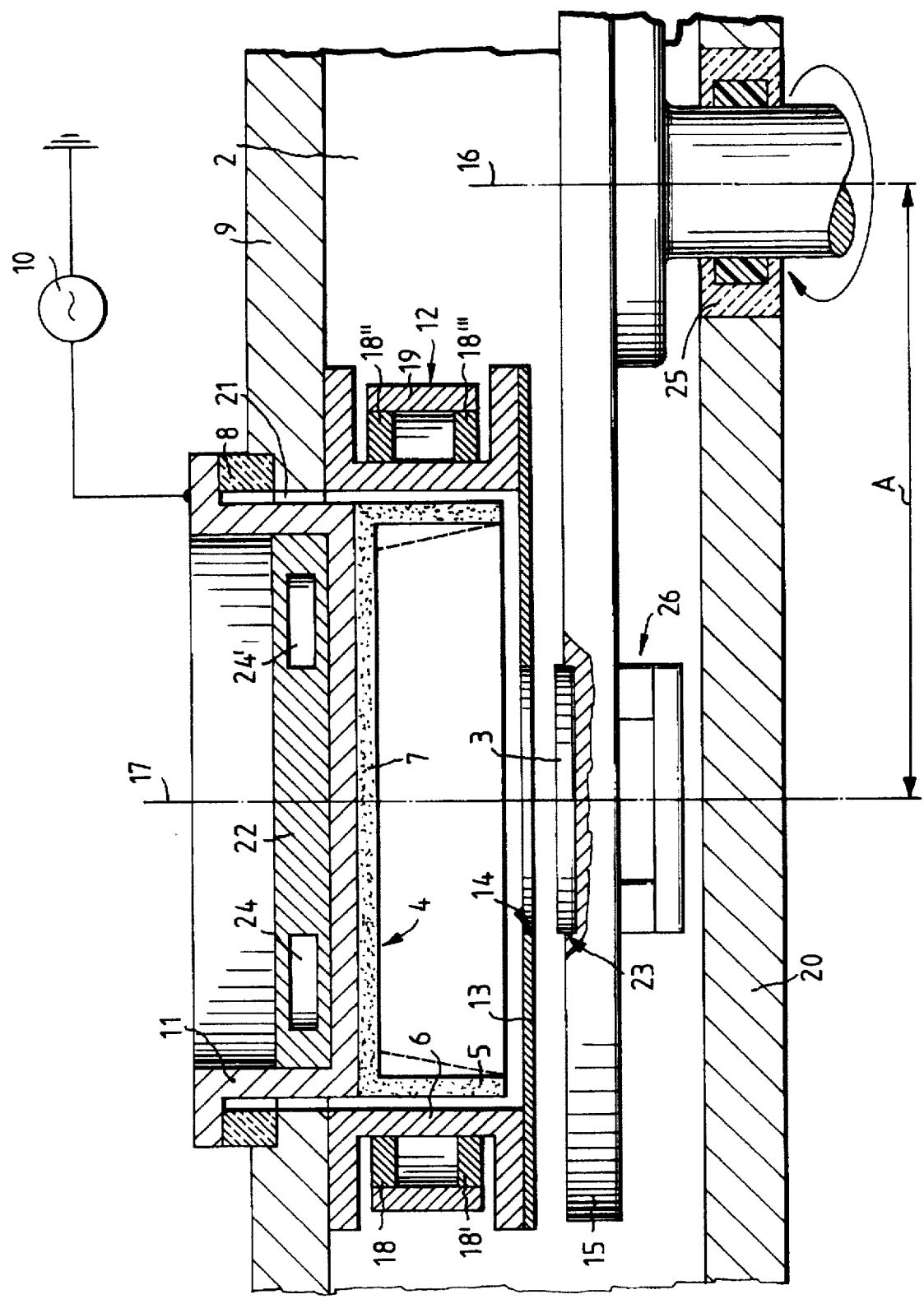

APPARATUS FOR COATING SUBSTRATES BY CATHODE SPUTTERING WITH A HOLLOW TARGET

The invention relates to an apparatus for coating substrates by cathode sputtering with a hollow target with an opening aimed at the substrate.

A system is known for coating substrates by cathode sputtering (DE 35 06 227 C2) having a cathode in the form of a hollow body with an opening facing the substrate, and an anode. A magnet system is provided on the outside of the hollow cathode body facing away from the substrate for the purpose of confining the sputtering zone to the inside of the cathode, and the magnet system is configured such that during operation two sputtering zones form on the inside of the cathode being sputtered, and the ratio of the sputtering powers of the two sputtering zones is variable. The hollow body of the cathode is in the form of a hollow cylinder open at one end, and a first sputtering zone is limited substantially to the inside cylindrical surface and a second sputtering zone is limited to the closed end of the cylinder.

The known arrangement has the advantage of improved step coverage combined with undiminished uniformity of coating thickness.

Also known is a coating apparatus (EP 0 459 413 A2) in which the substrate is disposed on a turntable and moves during the coating process between two targets, both of which are connected to an RF source and, separated from one another by a mask, they are held lying flat on the turntable. The known coating apparatus serves primarily for the production of magnetic recording layers consisting of a sandwich whose layers are formed by cobalt layers alternating with platinum or palladium layers.

SUMMARY OF THE INVENTION

The sputtering source according to the invention of comparatively simple construction and therefore economical to manufacture, will permit low-energy deposition with a minimum of flaws and radiation damage to the individual layers and their boundary surfaces, and is free of any inert gas inclusion. The coatings can be deposited as MR/GMR coatings (magneto-resistive/gigant magneto-resistive) and are suitable especially for thin-film heads.

A dark-space shield surrounds the lateral wall of the target, and a cathode base is affixed to the top of the target, supported on an insulator on the roof of the vacuum chamber, and connected electrically to a power source. A magnetic belt formed of a plurality of magnets surrounds the dark space shield, and a diaphragm with a central opening held by the dark-space shield. A turntable is mounted for rotation for the purpose of holding the substrate, its axis of rotation is parallel to and offset laterally from the target's plane of symmetry.

SUMMARY OF THE INVENTION

The sole FIGURE is a diagrammatic cross-section of the coating apparatus.

DETAILED DESCRIPTION OF THE PREFERRED EMBODIMENT

The apparatus consists essentially of a cathode body 11 held in an opening 21 in the roof 9 of the vacuum chamber 2, resting on an insulating ring 8, and having a cooler 22 inserted in it; of a target 4 in the form of an inverted pot with a cylindrical outer wall 5, which is soldered to the cathode body 11; a darkspace shield 6 having external flanges and encircling the outer wall 5 at a distance therefrom; a magnet ring 12 consisting of a plurality of individual permanent magnets 18, 18' connected by an annular yoke 19, and a turntable 15 which is journaled in the floor 20 of the vacuum chamber and has on its circular upper surface substrates 3 held in depressions 23.

After the vacuum chamber 2 has been pumped out and a process gas such as argon has been admitted, the turntable 18 is rotated, so that the individual substrates 3 pass one by one together with the magnet array 26 underneath the diaphragm, and become coated with the particles of material knocked out of the target. The individual parameters, such as the rotational speed of the turntable and the electrical power applied to the cathode 29, are selected such that a uniform and homogeneous coating is deposited on the substrates 3. To prevent overheating the target 4, the cathode body 11 is provided with a cooler 22 whose cooling passages 24, 24' are connected to a source of coolant liquid. Instead of a cylindrical interior surface on the lateral wall of the target 4 a slightly tapering inside surface can be provided, as indicated in the drawing by a broken line.

Advantageously, a magnet array 26 is provided in the range of the depression 23 provided for the substrate 3.

I claim:

1. Apparatus for coating substrates by cathode sputtering, said apparatus comprising a vacuum chamber having a roof and a base, a cathode base body supported on said roof by an insulator, a hollow target fixed to said cathode base body in said vacuum chamber, said hollow target having a lateral wall with a plane of symmetry and a downward facing opening, a dark space shield surrounding said lateral wall of said cathode base body, a plurality of magnets surrounding said dark space shield and arranged to form a magnetic field inside said target, a turntable having an axis of rotation parallel to said plane of symmetry, said turntable carrying said substrates through a position beneath said opening.

2. Apparatus as in claim 1 further comprising a diaphragm fixed to said lateral wall and extending radially inward to a central aperture between said downward facing opening and said position.

3. Apparatus as in claim 1 wherein said lateral wall has an inner surface which is upwardly convergent.

4. Apparatus as in claim 1 wherein said turntable is journaled in said chamber by an insulating bushing so that said turntable can be charged as an anode independently of said chamber.

5. Apparatus as in claim 1 wherein said dark space shield comprises a wall portion parallel to said lateral wall of said target and a pair of limbs extending radially outward from said wall portion, said magnets being located between said limbs.

* * * * *